US010735113B2

(12) United States Patent
Noda et al.

(10) Patent No.: US 10,735,113 B2
(45) Date of Patent: Aug. 4, 2020

(54) NEAR-FIELD MEASUREMENT SYSTEM AND NEAR-FIELD MEASUREMENT METHOD

(71) Applicant: ANRITSU CORPORATION, Kanagawa (JP)

(72) Inventors: Hanako Noda, Kanagawa (JP); Masaaki Fuse, Kanagawa (JP)

(73) Assignee: ANRITSU CORPORATION, Kanagawa (JP)

(*) Notice: Subject to any disclaimer, the term of this patent is extended or adjusted under 35 U.S.C. 154(b) by 454 days.

(21) Appl. No.: 15/703,283

(22) Filed: Sep. 13, 2017

(65) Prior Publication Data
US 2018/0091240 A1 Mar. 29, 2018

(30) Foreign Application Priority Data

Sep. 27, 2016 (JP) .................................. 2016-187726
Jun. 13, 2017 (JP) .................................. 2017-116002

(51) Int. Cl.
*H04B 17/10* (2015.01)
*G01R 29/08* (2006.01)
*G01R 29/10* (2006.01)

(52) U.S. Cl.
CPC ....... *H04B 17/104* (2015.01); *G01R 29/0878* (2013.01); *G01R 29/10* (2013.01); *H04B 17/102* (2015.01); *G01R 29/0892* (2013.01)

(58) Field of Classification Search
CPC .......... H04B 7/04; H04B 7/08; H04B 7/0837; H04B 7/38; H04B 7/40; H04B 17/00; H04B 17/101; H04B 17/102; H04B 17/104; H04B 17/20; H04B 17/21; H04B 17/29; H04B 17/309; G01R 29/08; G01R 29/0878; G01R 29/0892; G01R 29/10; G01R 29/14
USPC ....... 375/224, 226, 260, 261, 267, 354, 356; 370/208, 332, 334, 350; 455/41.1, 67.11, 455/67.13
See application file for complete search history.

(56) References Cited

U.S. PATENT DOCUMENTS 4,789,897 A * 12/1988 Kappeler ................. H03D 1/24
   348/678
6,415,004 B1 * 7/2002 Fujimura .............. H04L 7/0334
   329/306

(Continued)

FOREIGN PATENT DOCUMENTS

JP        H06-16058 B2    3/1994

*Primary Examiner* — Young T Tse
(74) *Attorney, Agent, or Firm* — Pearne & Gordon LLP

(57) ABSTRACT

A near-field measurement system includes a measurement probe 11 that receives a radio signal that is transmitted from an antenna under measurement 110 at a plurality of measurement positions included in a predetermined scan range, a frequency converter 13 that frequency-converts a frequency of the radio signal to a desired frequency, a timing processing unit 18 that generates a timing signal for starting measurement of an amplitude and a phase of the radio signal from a trigger signal output from a transmission device 100 in synchronization with transmission of the radio signal, and an amplitude and phase calculation unit 19 that acquires a radio signal frequency-converted by a frequency converter 13 and digitized by an A/D converter 14a on the basis of a timing signal for each measurement position and calculates an amplitude and a phase in a near field of the acquired radio signal.

20 Claims, 16 Drawing Sheets

(56) References Cited

U.S. PATENT DOCUMENTS

| | | | |
|---|---|---|---|
| 2005/0147190 A1* | 7/2005 | Nishikawa | H04L 27/0014 |
| | | | 375/343 |
| 2009/0117870 A1* | 5/2009 | Ikeda | H04B 1/0039 |
| | | | 455/313 |
| 2012/0170696 A1* | 7/2012 | Taniguchi | H03G 3/3052 |
| | | | 375/346 |
| 2016/0254870 A1* | 9/2016 | O'Keeffe | H01Q 21/24 |
| | | | 455/67.14 |

* cited by examiner

NEAR-FIELD MEASUREMENT SYSTEM AND NEAR-FIELD MEASUREMENT METHOD

BACKGROUND

The present invention relates to a near-field measurement system and a near-field measurement method and, more particularly, to a near-field measurement system and a near-field measurement method of measuring an electric field intensity distribution of an antenna in a near field region.

In recent years, in wireless communication such as mobile communication, modulated waves in a high frequency band of several GHz or more and a broadband of tens of MHz or more are used as a radio signal. Further, a transmission device that transmits a radio signal in a broader band, which corresponds to IEEE 802.11ad, 5G cellular, or the like in which a signal in a broader band that is a millimeter wave band is used, is needed in the future. Further, a demand for analysis of directivity of an antenna mounted on such a transmission device is assumed.

A near-field measurement system 200 that includes an antenna under measurement 220, a transmission device 210 that supplies a high frequency transmission signal to the antenna under measurement 220, a measurement antenna 51 that receives radio waves from the antenna under measurement 220 near the antenna under measurement 220, down-converters 53a and 53b, A/D converters 54a and 54b, and a calculation unit 55, and scans the measurement antenna 51 and measures a near field in a two-dimensional plane facing the antenna under measurement 220 as illustrated in FIG. 17 has been conventionally proposed as a device for measuring, in a near field region, an electric field intensity distribution of an antenna in order to calculate directivity of the antenna (for example, see Patent Document 1).

The calculation unit 55 in the near-field measurement system 200 extracts phase information from a received signal of the measurement antenna 51. Further, the calculation unit 55 can measure amplitude of an electric field generated by the antenna under measurement 220 simultaneously with a phase thereof.

In the near-field measurement system 200 of the related art, a transmission signal output from the transmission device 210 is divided in front of the antenna under measurement 220 and input to the calculation unit 55 in the device via a down-converter 53b and an A/D converter 54b in order to obtain a reference of a phase. In such a configuration, it is necessary for the down-converter 53a for the measurement antenna 51 and the down-converter 53b for phase reference to be arranged in the device.

RELATED ART DOCUMENT

Patent Document

[Patent Document 1] JP-B-6-16058

BRIEF SUMMARY

However, since the near-field measurement system of the related art needs to have two down-converters in the device, the measurement device is expensive.

Further, a configuration in which the down-converter 53b is omitted by outputting a trigger signal (a synchronization signal) from a transmitter and measuring a phase on the basis of this trigger signal is contemplated, but there is a problem in that steepness of a rising edge of the signal is lost due to a trigger signal being drawn with a cable. This causes an error in a start timing of phase measurement, and also causes an error in a phase measurement result. The error can be reduced through a plurality of measurements and averaging, but it takes time to perform measurements.

The present invention has been made to solve such problems of the related art, and an object of the present invention is to provide a near-field measurement system that is capable of performing near-field measurement with less error by performing phase measurement on the basis of a timing signal for correcting deterioration of a synchronization signal output from a transmission device to reduce the number of frequency converters in the device, and is inexpensive, and a near-field measurement method.

Means for Solving the Problem

In order to solve the above problem, a near-field measurement system according to a first aspect of the present invention is a near-field measurement system that measures, in a near field, a radio signal that is transmitted from an antenna under measurement included in a transmission device, the device including: a measurement probe that receives the radio signal at a plurality of measurement positions included in a predetermined scan range; a movement device that moves the measurement probe to the plurality of measurement positions; a frequency converter that frequency-converts a frequency of the radio signal received by the measurement probe to a desired frequency; a first A/D converter that digitizes the radio signal frequency-converted by the frequency converter; and an amplitude and phase calculation unit that acquires the radio signal digitized by the first A/D converter for each measurement position and calculates an amplitude and a phase in a near field of the acquired radio signal, wherein the near-field measurement system further includes: a second A/D converter that digitizes a synchronization signal output from the transmission device in synchronization with the transmission of the radio signal; and a timing processing unit that generates a timing signal for starting measurement of the amplitude and the phase of the radio signal from the synchronization signal digitized by the second A/D converter, and wherein the amplitude and phase calculation unit acquires the digitized radio signal on the basis of the timing signal.

With this configuration, in the near-field measurement system according to the present invention, it is possible to reduce the number of frequency converters in the device by performing phase measurement on the basis of the timing signal for correcting deterioration of the synchronization signal output from the transmission device, and perform near-field measurement of which an error is small with an inexpensive configuration.

Further, the near-field measurement system according to a 2nd aspect, further including: a local signal source that outputs a local signal; a first clock signal source that outputs a first clock signal; and a second clock signal source that outputs a second clock signal, wherein the antenna under measurement includes a plurality of antenna elements (T1 to TN), the frequency converter mixes the radio signal received by the measurement probe with the local signal, and the first A/D converter samples the radio signal frequency-converted by the frequency converter with the first clock signal, and the second A/D converter samples the synchronization signal with the second clock signal. Further, in the near-field measurement system according to a 3rd aspect of the present invention, the transmission device may include: a reference signal source that outputs a reference signal; a radio signal generation unit that generates the radio signal synchronized with the reference signal; and a trigger signal generation unit that generates the synchronization signal synchronized with the reference signal, wherein the local signal, the first clock signal, and the second clock signal may be synchronized with the reference signal, and each of a frequency of the local signal and a frequency of the radio signal may be an integer multiple of a frequency of the synchronization signal.

With this configuration, the near-field measurement system according to the present invention can execute phase measurement of the radio signal at each measurement position at a timing at which a phase of the radio signal is constant at a predetermined measurement position.

Further, the near-field measurement system according to a 4th aspect of the present invention may further include: a far-field directivity calculation unit that calculates directivity of a far field using information on the amplitude and the phase calculated by the amplitude and phase calculation unit.

Further, in the near-field measurement system according to a 5th aspect of the present invention, the timing processing unit may include: a signal source that generates a reference signal of the synchronization signal on the basis of information on the synchronization signal output from the transmission device; and a correlator that outputs, as the timing signal, a signal obtained by cross-correlation between the reference signal generated by the signal source and the synchronization signal digitized by the second A/D converter.

With this configuration, the near-field measurement system according to the present invention can use a timing of a reference signal inside the measurement device as a reference for phase measurement.

Further, in the near-field measurement system according to a 6th aspect of the present invention, the timing processing unit may include: a phase calculation unit that calculates a phase from the synchronization signal digitized by the second A/D converter on the basis of information on the synchronization signal output from the transmission device; and a timing signal generation unit that generates the timing signal on the basis of the phase calculated by the phase calculation unit.

With this configuration, the near-field measurement system according to the present invention can generate a timing signal from phase information on the synchronization signal from the transmission device.

Further, in the near-field measurement system according to a 7nd aspect of the present invention, the timing processing unit may include: a numerically controlled oscillator that controls a frequency of an output signal according to an input signal; an in-loop frequency divider that divides an output signal from the numerically controlled oscillator by 1/N; a phase comparator that outputs an error signal according to a phase difference between the output signal divided by the in-loop frequency divider and the synchronization signal digitized by the second A/D converter; and a loop filter that passes a low frequency component of the error signal and applies the low frequency component to the numerically controlled oscillator, wherein the output signal from the numerically controlled oscillator is input to the amplitude and phase calculation unit as the timing signal.

With this configuration, the near-field measurement system according to the present invention can use a signal phase-synchronized with the synchronization signal from the transmission device as a timing signal.

Further, in the near-field measurement system according to an 8th aspect, the timing processing unit may include: a low pass filter that passes a low frequency component of the synchronization signal digitized by the second A/D converter; and a threshold processing unit that outputs, as the timing signal, a signal obtained by performing threshold processing on the synchronization signal passing through the low pass filter.

With this configuration, the near-field measurement system according to the present invention can use a signal obtained by waveform-shaping the synchronization signal from the transmission device as a timing signal.

Further, in the near-field measurement system according to a 9th aspect of the present invention, the timing processing unit may include: a waveform shaping unit that changes frequency characteristics of the synchronization signal digitized by the second A/D converter; and a threshold processing unit that outputs, as the timing signal, a signal obtained by performing threshold processing on the synchronization signal of which frequency characteristics have been changed by the waveform shaping unit.

With this configuration, the near-field measurement system according to the present invention can use a signal obtained by waveform-shaping the synchronization signal from the transmission device as a timing signal. Further, the near-field measurement system according to a 10th aspect of the present invention further includes: a far-field directivity calculation unit that calculates directivity of a far field using information on the amplitude and the phase calculated by the amplitude and phase calculation unit. Further, in the near-field measurement system according to an 11th aspect of the present invention, the timing processing unit includes: a signal source that generates a reference signal of the synchronization signal on the basis of information on the synchronization signal output from the transmission device; and a correlator that outputs, as the timing signal, a signal obtained by cross-correlation between the reference signal generated by the signal source and the synchronization signal digitized by the second A/D converter. In the near-field measurement system according to claim a 12th aspect of the present invention, the timing processing unit includes: a signal source that generates a reference signal of the synchronization signal on the basis of information on the synchronization signal output from the transmission device; and a correlator that outputs, as the timing signal, a signal obtained by cross-correlation between the reference signal generated by the signal source and the synchronization signal digitized by the second A/D converter. Further, in the near-field measurement system according to a 13th aspect of the present invention, the timing processing unit includes: a phase calculation unit that calculates a phase from the synchronization signal digitized by the second A/D converter on the basis of information on the synchronization signal output from the transmission device; and a timing signal generation unit that generates the timing signal on the basis of the phase calculated by the phase calculation unit. Further, in the near-field measurement system according to a 14th aspect of the present invention, the timing processing unit includes: a phase calculation unit that calculates a phase from the synchronization signal digitized by the second A/D converter on the basis of information on the synchronization signal output from the transmission device; and a timing signal generation unit that generates the timing signal on the basis of the phase calculated by the phase calculation unit. Further, in the near-field measurement system according to a 15th aspect of the present invention, the timing processing unit includes: a numerically controlled oscillator that controls a frequency of an output signal according to an input signal; an in-loop frequency divider that divides an output signal from the numerically controlled oscillator by 1/N; a phase comparator that outputs an error signal according to a phase difference between the output signal divided by the in-loop frequency divider and the synchronization signal digitized by the second A/D converter; and a loop filter that passes a low frequency component of the error signal and applies the low frequency component to the numerically controlled oscillator, wherein the output signal from the numerically controlled oscillator is input to the amplitude and phase calculation unit as the timing signal. Further, in the near-field measurement system according to a 16th aspect of the present invention, the timing processing unit includes: a numerically controlled oscillator that controls a frequency of an output signal according to an input signal; an in-loop frequency divider that divides an output signal from the numerically controlled oscillator by 1/N; a phase comparator that outputs an error signal according to a phase difference between the output signal divided by the in-loop frequency divider and the synchronization signal digitized by the second A/D converter; and a loop filter that passes a low frequency component of the error signal and applies the low frequency component to the numerically controlled oscillator, wherein the output signal from the numerically controlled oscillator is input to the amplitude and phase calculation unit as the timing signal. Further, in the near-field measurement system according to a 17th aspect of the present invention, the timing processing unit includes: a low pass filter that passes a low frequency component of the synchronization signal digitized by the second A/D converter; and a threshold processing unit that outputs, as the timing signal, a signal obtained by performing threshold processing on the synchronization signal passing through the low pass filter. Further, in the near-field measurement system according to a 18th aspect of the present invention, the timing processing unit includes: a low pass filter that passes a low frequency component of the synchronization signal digitized by the second A/D converter; and a threshold processing unit that outputs, as the timing signal, a signal obtained by performing threshold processing on the synchronization signal passing through the low pass filter. Further, in the near-field measurement system according to a 19th aspect of the present invention, the timing processing unit includes: a waveform shaping unit that changes frequency characteristics of the synchronization signal digitized by the second A/D converter; and a threshold processing unit that outputs, as the timing signal, a signal obtained by performing threshold processing on the synchronization signal of which frequency characteristics have been changed by the waveform shaping unit.

Further, a near-field measurement method according to a 20th aspect of the present invention is a near-field measurement method using any one of the near-field measurement systems, the near-field measurement method including: a radio signal transmission step of transmitting the radio signal and the synchronization signal synchronized with the transmission of the radio signal from the transmission device; a movement step of moving the measurement probe to one of the measurement positions; a signal reception step of receiving the radio signal using the measurement probe at the plurality of measurement positions included in the predetermined scan range; a frequency conversion step of frequency-converting the frequency of the radio signal received in the signal reception step to the desired frequency using the frequency converter; a first A/D conversion step of digitizing the radio signal frequency-converted in the frequency conversion step using the first A/D converter; a second A/D conversion step of digitizing the synchronization signal transmitted in the radio signal transmission step using the second A/D converter; a timing processing step of generating the timing signal for starting measurement of the amplitude and the phase of the radio signal from the synchronization signal digitized in the second A/D conversion step; an amplitude and phase calculation step of acquiring the radio signal digitized in the first A/D conversion step on the basis of the timing signal for each measurement position and calculating an amplitude and a phase in a near field of the acquired radio signal; and a far field directivity calculation step of calculating the directivity of the far field using information on the amplitude and the phase calculated in the amplitude and phase calculation step.

With this configuration, in the near-field measurement method according to the present invention, it is possible to reduce the number of frequency converters in the device by performing phase measurement on the basis of the timing signal for correcting deterioration of the synchronization signal output from the transmission device, and perform near-field measurement of which an error is small with an inexpensive configuration.

Advantage of the Invention

The present invention provides a near-field measurement system that is capable of performing near-field measurement with less error by performing phase measurement on the basis of a timing signal for correcting deterioration of a synchronization signal output from a transmission device to reduce the number of frequency converters in the device, and is inexpensive, and a near-field measurement method.

BRIEF DESCRIPTION OF THE SEVERAL VIEWS OF THE DRAWING(S)

DETAILED DESCRIPTION

Hereinafter, embodiments of a near-field measurement system and a near-field measurement method according to the present invention will be described with reference to the drawings.

First Embodiment

Figure 1:
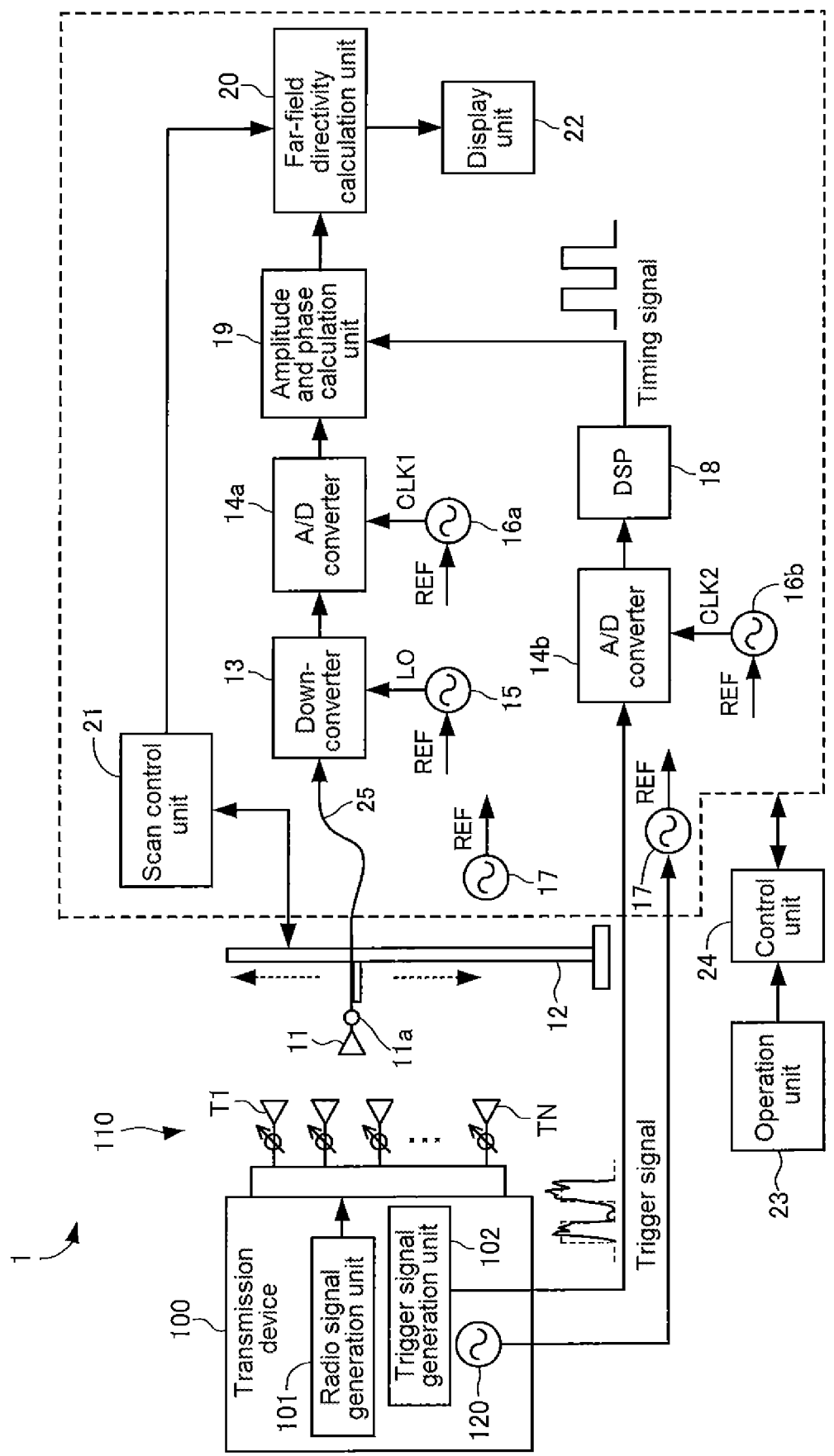
FIG. 1 is a block diagram illustrating a configuration of a near-field measurement system according to a first embodiment.

As illustrated in FIG. 1, a near-field measurement system 1 according to a first embodiment of the present invention measures a radio signal transmitted from an antenna under measurement 110 including a plurality of antenna elements T1 to TN included in a transmission device 100 in a near field, and calculates directivity of a far field. The antenna under measurement 110 is, for example, an array antenna including a Massive-MIMO antenna. The antenna under measurement 110 may be integrated with the transmission device 100 or may be removable from the transmission device 100.

The transmission device 100 includes a reference signal source 120 that outputs a reference signal, a radio signal generation unit 101 that generates a radio signal synchronized with the reference signal output from the reference signal source 120, and a trigger signal generation unit 102 that generates a trigger signal as a synchronization signal synchronized with the reference signal output from the reference signal source 120.

The radio signal generation unit 101 included in the transmission device 100 generates, for example, a radio signal such as a non-modulated wave signal or a wideband signal (for example, an OFDM signal), and outputs the generated radio signal to the antenna under measurement 110 of the transmission device 100 to cause the radio signal to be transmitted from the antenna under measurement 110.

The near-field measurement system 1 mainly includes a measurement probe 11, a movement device 12, a down-converter 13 as a frequency converter, an A/D converter 14a as a first A/D converter, a A/D converter 14b as a second A/D converter, a local signal source 15, a clock signal source 16a as a first clock signal source, a clock signal source 16b as a second clock signal source, a reference signal source 17, a digital signal processor (DSP) 18 as a timing processing unit, an amplitude and phase calculation unit 19, a far-field directivity calculation unit 20, a scan control unit 21, a display unit 22, an operation unit 23, and a control unit 24.

Among these, the down-converter 13, the A/D converters 14a and 14b, the local signal source 15, the clock signal sources 16a and 16b, the reference signal source 17, the DSP 18, and the amplitude and phase calculation unit 19 can be all configured with a vector network analyzer (VNA).

The measurement probe 11 is an antenna that receives, in a near field, radio waves radiated from the antenna under measurement 110 including the plurality of antenna elements T1 to TN of the transmission device 100, and includes, for example, a waveguide that has a transmission line through which an electromagnetic wave in a predetermined frequency range is propagated, in which a tip is opened. The measurement probe 11 receives the radio signal transmitted from the antenna under measurement 110 of the transmission device 100 at a plurality of scan points (hereinafter also referred to as "measurement positions") included in a predetermined scan range of a near-field region. These measurement positions are set on a plane, for example.

Figure 2:
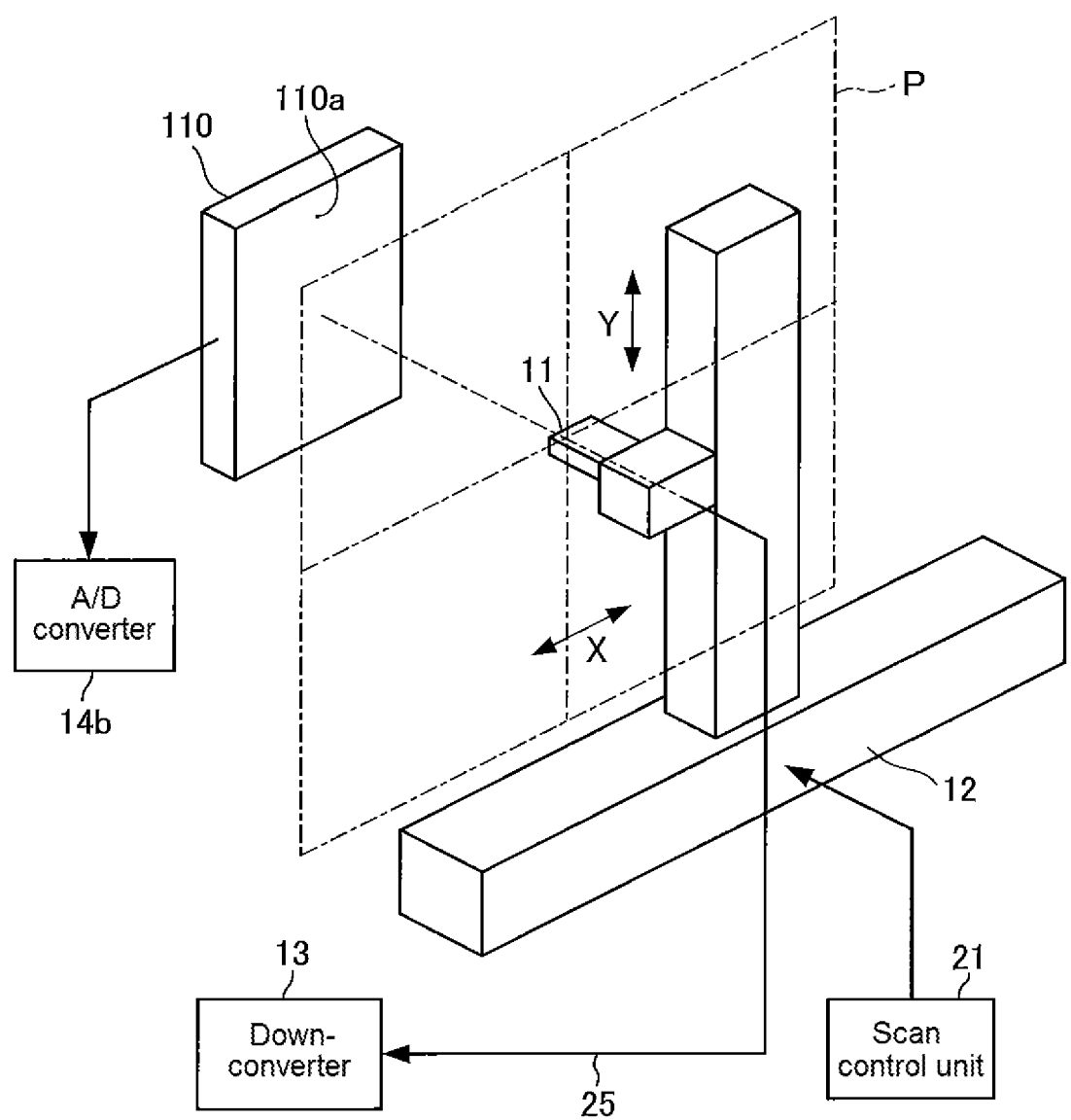
FIG. 2 is a perspective view illustrating a positional relationship between a measurement antenna and an antenna under measurement in a near-field measurement system according to the first embodiment.

As illustrated in FIG. 2, the movement device 12 moves the measurement probe 11 to a plurality of measurement positions included in a predetermined scan range P. The movement device 12 moves the measurement probe 11 in X and Y directions in a near scan range P facing an electromagnetic wave radiation surface 110a of the antenna under measurement 110.

The down-converter 13 mixes the radio signal received by the measurement probe 11 with the local signal from the local signal source 15 to frequency-convert a frequency of the radio signal into a desired frequency suitable for a subsequent process.

The measurement probe 11 is connected to the down-converter 13 by connecting a cable 25 such as a coaxial cable to a connector 11a of the measurement probe 11. Alternatively, the measurement probe 11 may be directly connected to the down-converter 13 such that a frequency of the radio signal decreases before the radio signal is transferred through the cable.

The local signal source 15 includes, for example, a PLL circuit, and generates a local signal synchronized with a phase of the reference signal that is input from the reference signal source 17, by changing a frequency.

As illustrated in FIG. 1, the A/D converter 14a digitizes (samples and quantizes) the radio signal subjected to the frequency-conversion in the down-converter 13. Specifically, the A/D converter 14a samples the radio signal after frequency conversion with a first clock signal from the clock signal source 16a to generate a digital signal for measurement as time series digital data.

The A/D converter 14b digitizes (samples and quantizes) the trigger signal that is output from the trigger signal generation unit 102 of the transmission device 100 in synchronization with the transmission of the radio signal. Specifically, the A/D converter 14b samples the trigger signal with a second clock signal from the clock signal source 16b to generate a digital synchronization signal as time series digital data.

The reference signal source 17 generates, for example, a non-modulated wave signal or a clock signal at 10 MHz synchronized with the reference signal output from the reference signal source 120 of the transmission device 100 as a reference synchronization signal between the local signal source 15 and the clock signal sources 16a and 16b.

Figure 3:
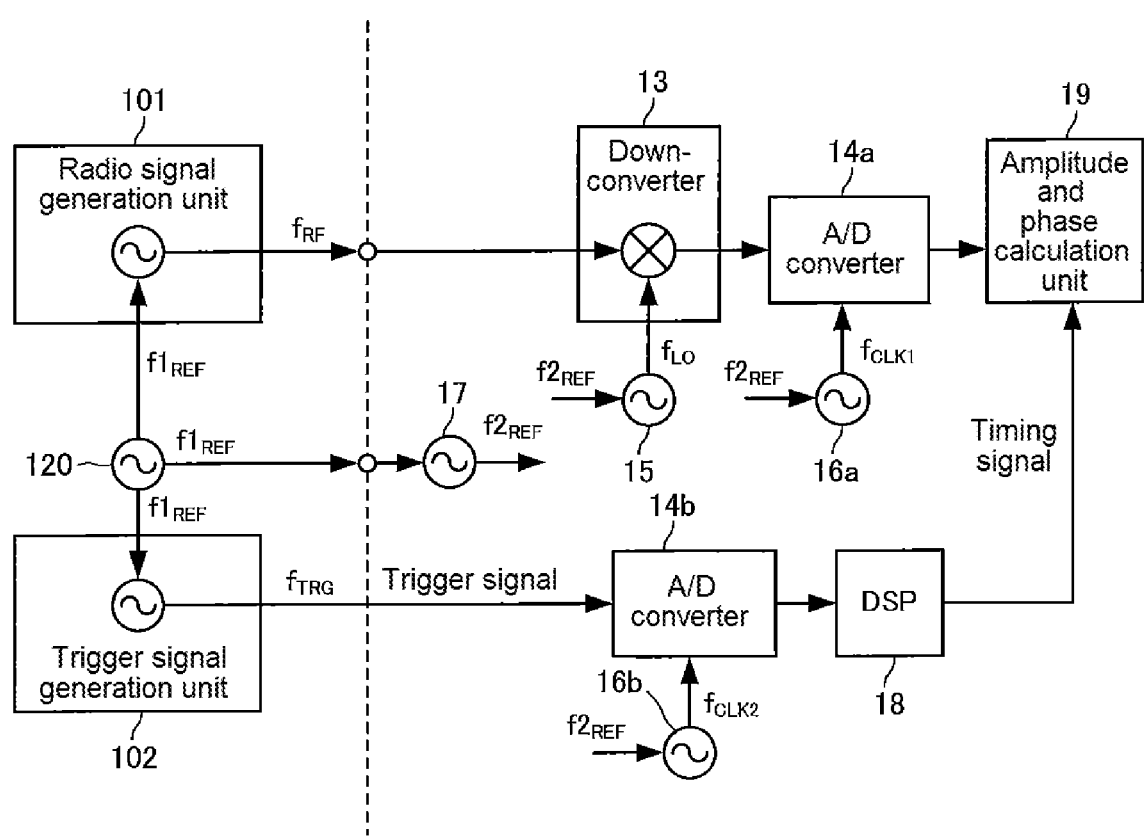
FIG. 3 is a diagram illustrating a synchronization state in a near-field measurement system and a transmission device according to the first embodiment.

FIG. 3 is a diagram illustrating a synchronization state in the transmission device 100 and the near-field measurement system 1. The reference signal of a frequency $f2_{REF}$ from the reference signal source 17 is synchronized with the reference signal at a frequency $f1_{REF}$ from the reference signal source 120. Further, the local signal at a frequency $f_{LO}$ from the local signal source 15, the first clock signal at a frequency $f_{CLK1}$ from the clock signal source 16a, and the second clock signal at a frequency $f_{CLK2}$ from the clock signal source 16b are synchronized with the reference signal at the frequency $f2_{REF}$ from the reference signal source 120.

Here, each of the frequency $f_{LO}$ of the local signal and the frequency $f_{RF}$ of the radio signal from the radio signal generation unit 101 is an integer multiple of a frequency $f_{TRG}$ of the trigger signal from the trigger signal generation unit 102. Further, each of the frequency $f_{CLK1}$ of the first clock signal and the frequency $f_{CLK2}$ of the second clock signal is an integer multiple of the frequency $f_{TRG}$ of the trigger signal.

Figure 4:
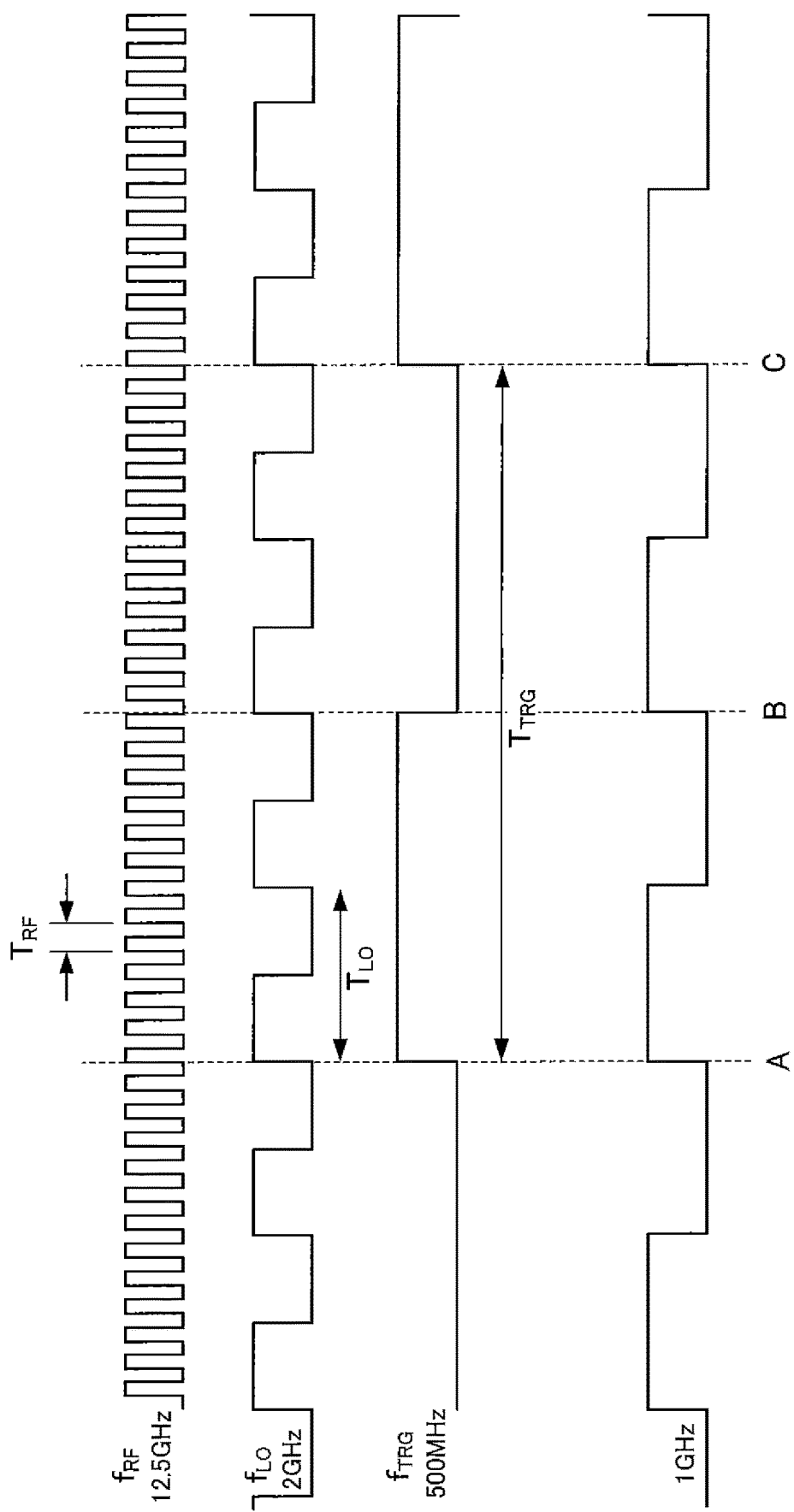
FIG. 4 is a timing chart showing a timing of a radio signal, a local signal, and a trigger signal.

For example, FIG. 4 illustrates timings of a signal waveform of the radio signal at a frequency $f_{RF}$ of 12.5 GHz, a signal waveform of the local signal at a frequency $f_{LO}$ of 2 GHz, a signal waveform of the trigger signal at a frequency $f_{TRG}$ of 500 MHz, and a signal waveform at a frequency of 1 GHz as a comparative example. The values of these frequencies are examples for ease of description, and values of the frequencies used in the near-field measurement system 1 of this embodiment are not limited thereto. Further, the respective signal waveforms are simplified and represented so that the timings in FIG. 4 are easily viewed.

In this case, one period $T_{TRG}$ of the trigger signal is 2 ns. Further, one period $T_{LO}$ of the local signal is 0.5 ns. Further, one period $T_{RF}$ of the radio signal is 0.08 ns. Thus, $T_{TRG}$ is four times of the $T_{LO}$ and is 25 times of $T_{RF}$. In a case where $f_{TRG}$ is 1 GHz, $T_{TRG}$ is 12.5 times of $T_{RF}$, and therefore, the phase of the radio signal at a timing B is shifted by 180° with respect to the phases of the radio signals at timings A and C illustrated in FIG. 4.

The DSP 18 as a timing processing unit illustrated in FIG. 1 generates a timing signal for starting measurement of an amplitude and a phase of the radio signal from the trigger signal digitized by the A/D converter 14b.

Figure 5:
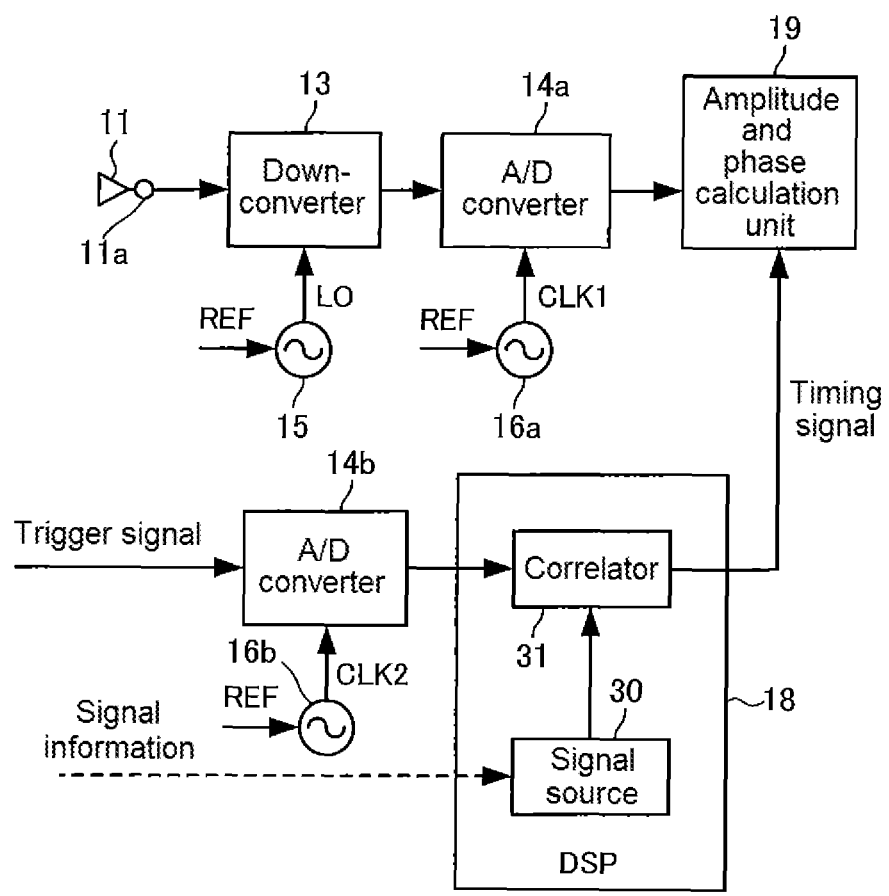
FIG. 5 is a block diagram illustrating a configuration of a DSP of a near-field measurement system according to the first embodiment.

As illustrated in FIG. 5, the DSP 18 includes a signal source 30 that generates a reference signal for the trigger signal on the basis of information on the trigger signal output from the transmission device 100, and a correlator 31 that outputs a signal obtained by cross-correlation between the reference signal generated by the signal source 30 and the trigger signal digitized by the A/D converter 14b as a timing signal.

In this embodiment, the trigger signal is a pulse signal. Further, the transmission device 100 outputs the information on the trigger signal to the signal source 30. Examples of the information on the trigger signal output to the signal source 30 include a duty ratio of the pulse and a value of a pulse period.

Figure 6A:
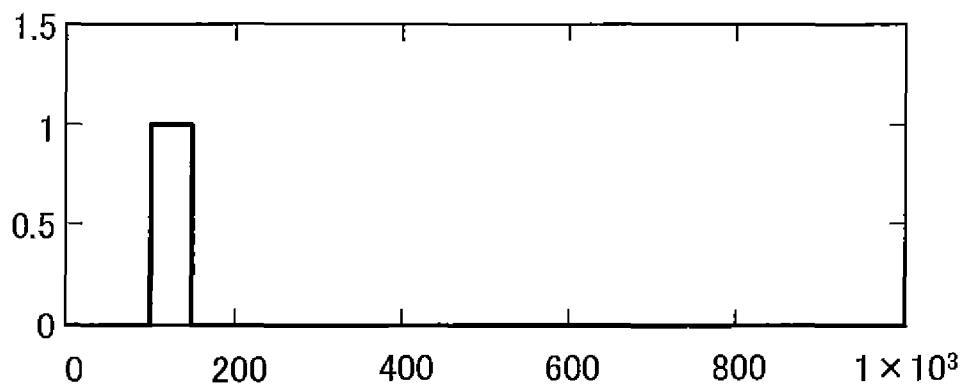
FIG. 6A is a graph showing an example of a reference signal that is output from a signal source in a DSP.
Figure 6B:
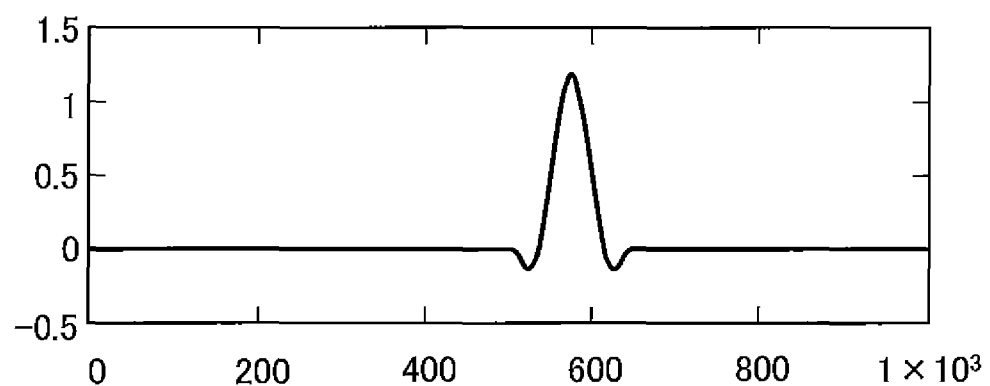
FIG. 6B is a graph showing an example of a trigger signal digitized by a second A/D converter.
Figure 6C:
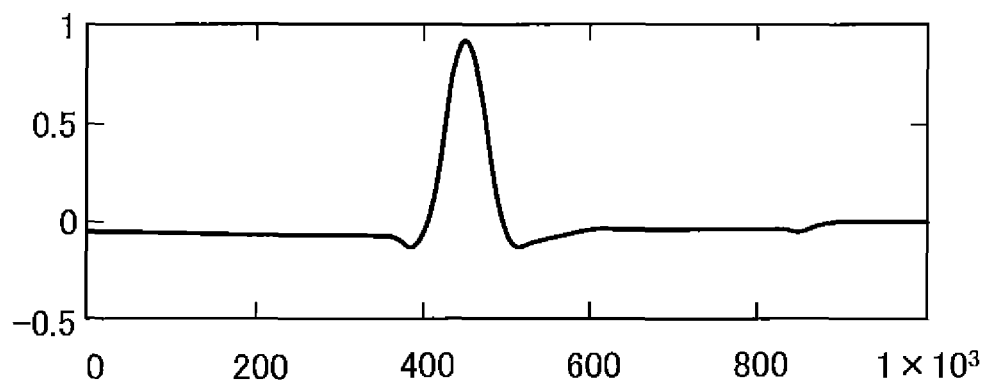
FIG. 6C is a graph showing a cross-correlation between the reference signal and the trigger signal.

FIG. 6A illustrates an example of the reference signal output from the signal source 30. Here, the reference signal is assumed to be a pulse signal similar to the trigger signal. FIG. 6B illustrates an example of the trigger signal digitized by the A/D converter 14b. FIG. 6C illustrates cross-correlation between the two signals illustrated in FIGS. 6A and 6B. In other words, the correlator 31 outputs a timing signal including information on a delay amount of the trigger signal on the basis of the reference signal to the amplitude and phase calculation unit 19.

The amplitude and phase calculation unit 19 acquires the radio signal (digital signal for measurement) digitized by the A/D converter 14a on the basis of the timing signal output from the DSP 18 for each measurement position in the scan range of the measurement probe 11, and calculates the amplitude and the phase of the acquired radio signal in the near field.

Figure 7:
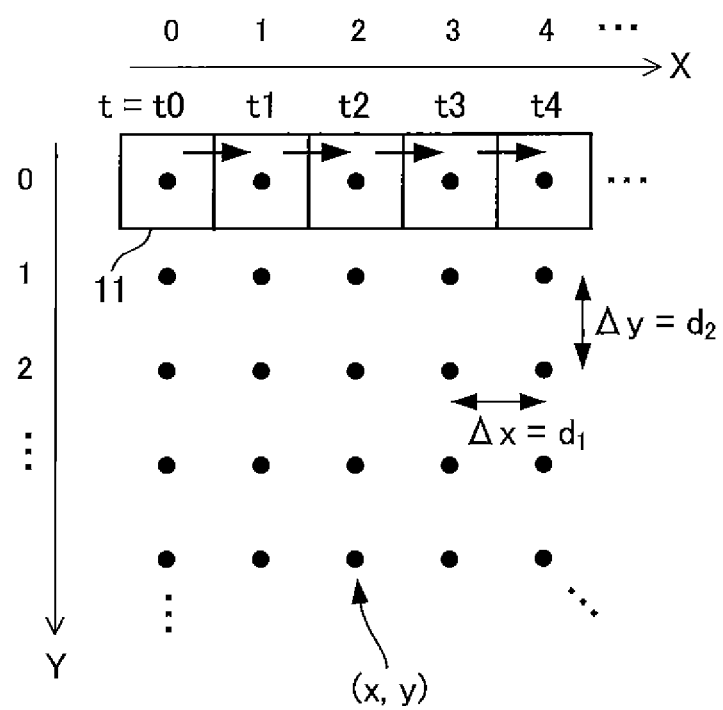
FIG. 7 is a schematic diagram illustrating an arrangement and a measurement position of a measurement probe.

Hereinafter, a specific example of a process of the amplitude and phase calculation unit 19 will be described. FIG. 7 is a schematic diagram illustrating the measurement positions (marks ● in FIG. 7) within the scan range P and an arrangement of the measurement probe 11. As illustrated in FIG. 7, the measurement positions can be represented as grid points in a case where the scan range P is divided in a grid pattern by Δx in an X direction and Δy in a Y direction. In FIG. 7, for example, a case where Δx=$d_1$ and Δy=$d_2$ is illustrated. It can be that $d_1$=$d_2$.

The measurement probe 11 is assumed to be at a position of coordinates (0, 0) in an initial state. First, at a rising time t0 of the timing signal, the amplitude and phase calculation unit 19 measures the phase of the radio signal received by the measurement probe 11 and measures the amplitude of the radio signal received by the measurement probe 11.

Next, measurement positions at which the phase and the amplitude are not measured are scanned with the measurement probe 11 by the movement device 12. For example, the measurement probe 11 is moved to a position of the coordinates (1, 0), as illustrated in FIG. 7.

Then, at a rising time t1 of the timing signal, the amplitude and phase calculation unit 19 measures the phase of the radio signal received by the measurement probe 11 and measures the amplitude of the radio signal received by the measurement probe 11. Here, since a difference between the time t1 and the time t0 is an integer multiple of one period $T_{TRG}$ of the trigger signal, it is possible to perform measurement of the phase of the radio signal at the coordinates (1, 0) while maintaining a constant phase relationship among the trigger signal, the local signal, and the clock signal.

Hereinafter, the amplitude and phase calculation unit repeats the same measurement at rising times t2, t3, t4, . . . of the timing signal in a state in which sequential scanning is performed with the measurement probe 11 in the X direction or the Y direction by the movement device 12. Thus, the amplitude and phase calculation unit 19 can measure the amplitude and the phase at each measurement position while maintaining a constant phase relationship among the trigger signal, the local signal, and the clock signal at a reference coordinate position. When the measurement of the amplitude and the phase is performed at all measurement positions, an order of scanning in the movement device 12 is arbitrary.

Figure 8A:
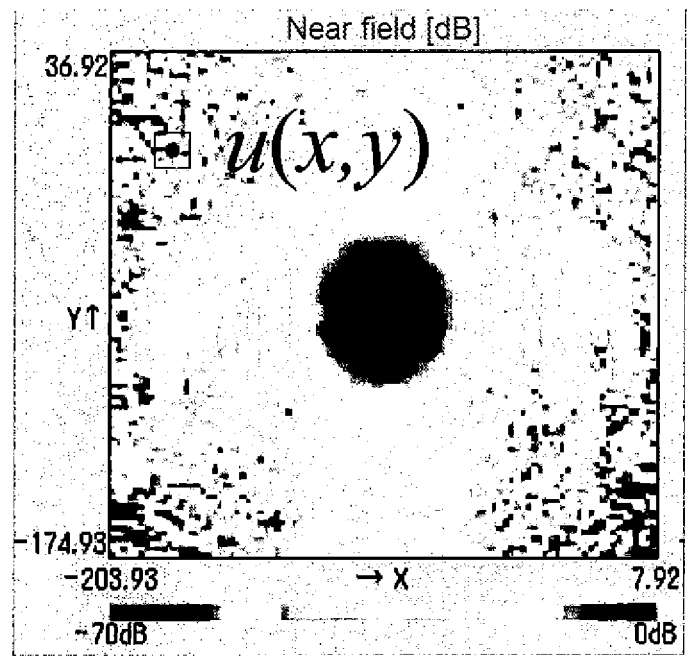
FIG. 8A is a graph showing an example of two-dimensional data of an amplitude that is calculated by an amplitude and phase calculation unit.
Figure 8B:
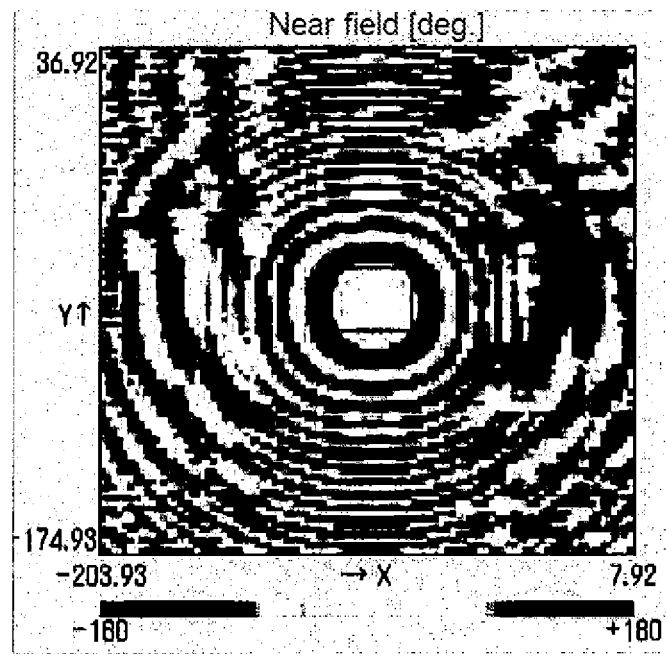
FIG. 8B is a graph showing an example of two-dimensional data of a phase that is calculated by the amplitude and phase calculation unit.

The amplitude and phase calculation unit 19 generates two-dimensional data of the amplitude as near-field measurement data, as illustrated in FIG. 8A. The amplitude and phase calculation unit 19 generates two-dimensional data of the phase as near-field measurement data, as illustrated in FIG. 8B. Here, u(x, y) in FIG. 8A indicates data of the radio signal that the measurement probe 11 has received at the position (x, y).

In a case where the radio signal transmitted from the antenna under measurement 110 of the transmission device 100 is a non-modulated wave, a phase for which the amount of processing has been suppressed can be detected, for example, using a cross-correlation function in the amplitude and phase calculation unit 19.

Further, the amplitude and phase calculation unit 19 outputs information on the calculated phase and amplitude (hereinafter also referred to as "phase information" and "amplitude information") to the far-field directivity calculation unit 20. The phase information at each measurement position may be information obtained by conversion into a value using a phase at a specific measurement position within the scan range as a reference (a zero phase).

The far-field directivity calculation unit 20 calculates the directivity of the far field using the position information on the measurement probe 11 output from the scanning control unit 21 to be described below and the information on the amplitude and the phase calculated by the amplitude and phase calculation unit 19.

Figure 9:
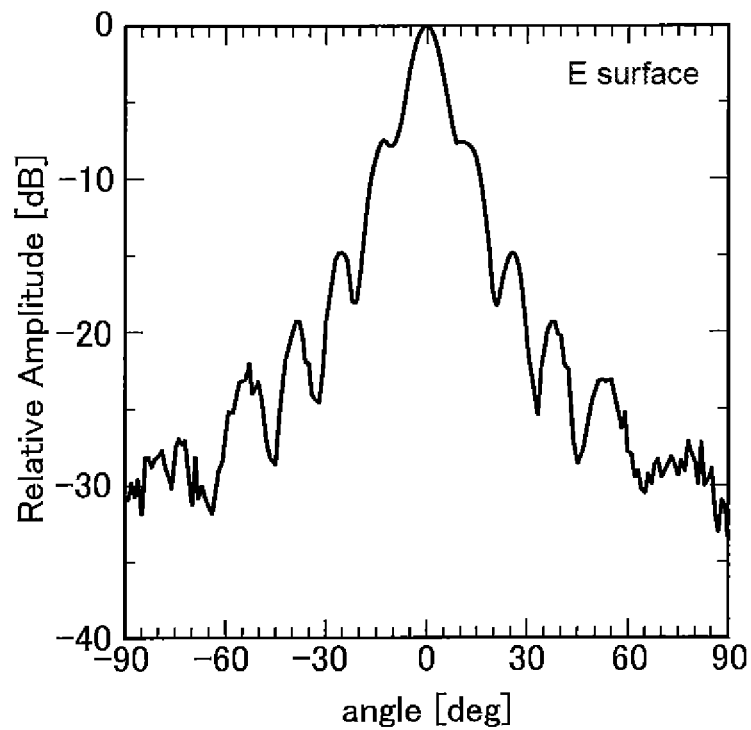
FIG. 9 is a graph showing an example of directivity of a far field that is calculated by a far-field directivity calculation unit.
Figure 9:
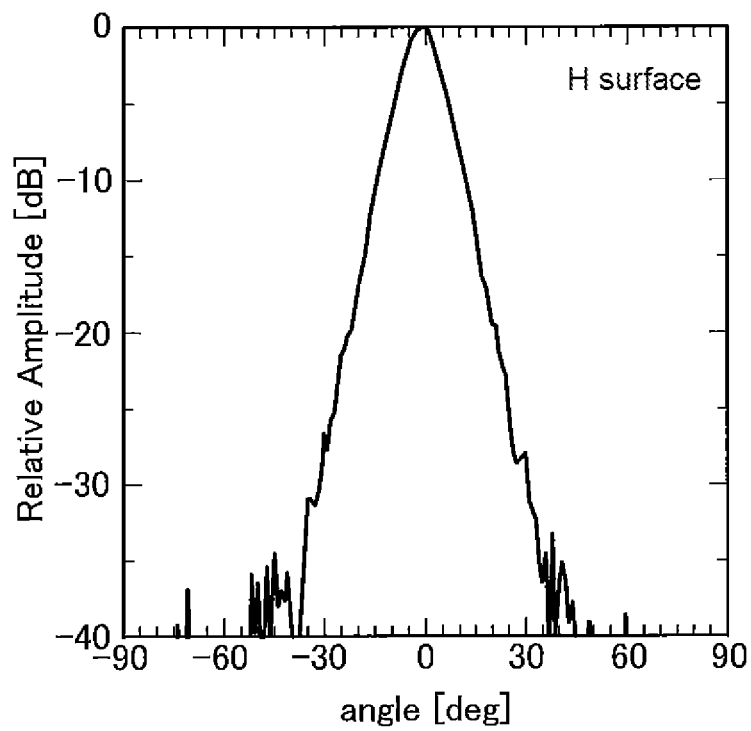

As illustrated in FIG. 9, the far-field directivity calculation unit 20 can obtain the directivity of the far field of the antenna under measurement 110 of the transmission device 100 by executing two-dimensional inverse Fourier transform for two-dimensional data of the amplitude and phase calculated by the amplitude and phase calculation unit 19.

The scan control unit 21 performs control to cause the movement device 12 to move the measurement probe 11 to all measurement positions within the scan range P in a predetermined order. For example, these measurement positions are arranged at positions corresponding to the grid points of a square grid within the scan range P. Further, the scan control unit 21 transmits position information on the measurement position at which there is the measurement probe 11 to the far-field directivity calculation unit 20.

The display unit 22 includes, for example, a display device such as an LCD or a CRT, and displays various kinds of display content according to a control signal from the control unit 24. This display content includes a result of the measurement of the amplitude and the phase in the near field of the antenna under measurement 110 or a result of the calculation of the directivity in the far field. Further, the display unit 22 may display operation targets such as soft keys for setting measurement conditions or the like, pull-down menus, and a text box.

The operation unit 23 is used for a user to perform an operation input, and includes an input device such as a keyboard, a touch panel, or a mouse. Alternatively, the operation unit 23 may be a configuration in which the operation target such as buttons, softkeys, a pull-down menu, and a text box are displayed on the display unit 22, as described above.

The control unit 24 includes, for example, a microcomputer or a personal computer including a CPU, a ROM, a RAM, and the like, and controls operations of the respective units constituting the near-field measurement system 1. Further, the control unit 24 constitutes the amplitude and phase calculation unit 19 and the far-field directivity calculation unit 20 in software by executing a predetermined program.

Figure 10:
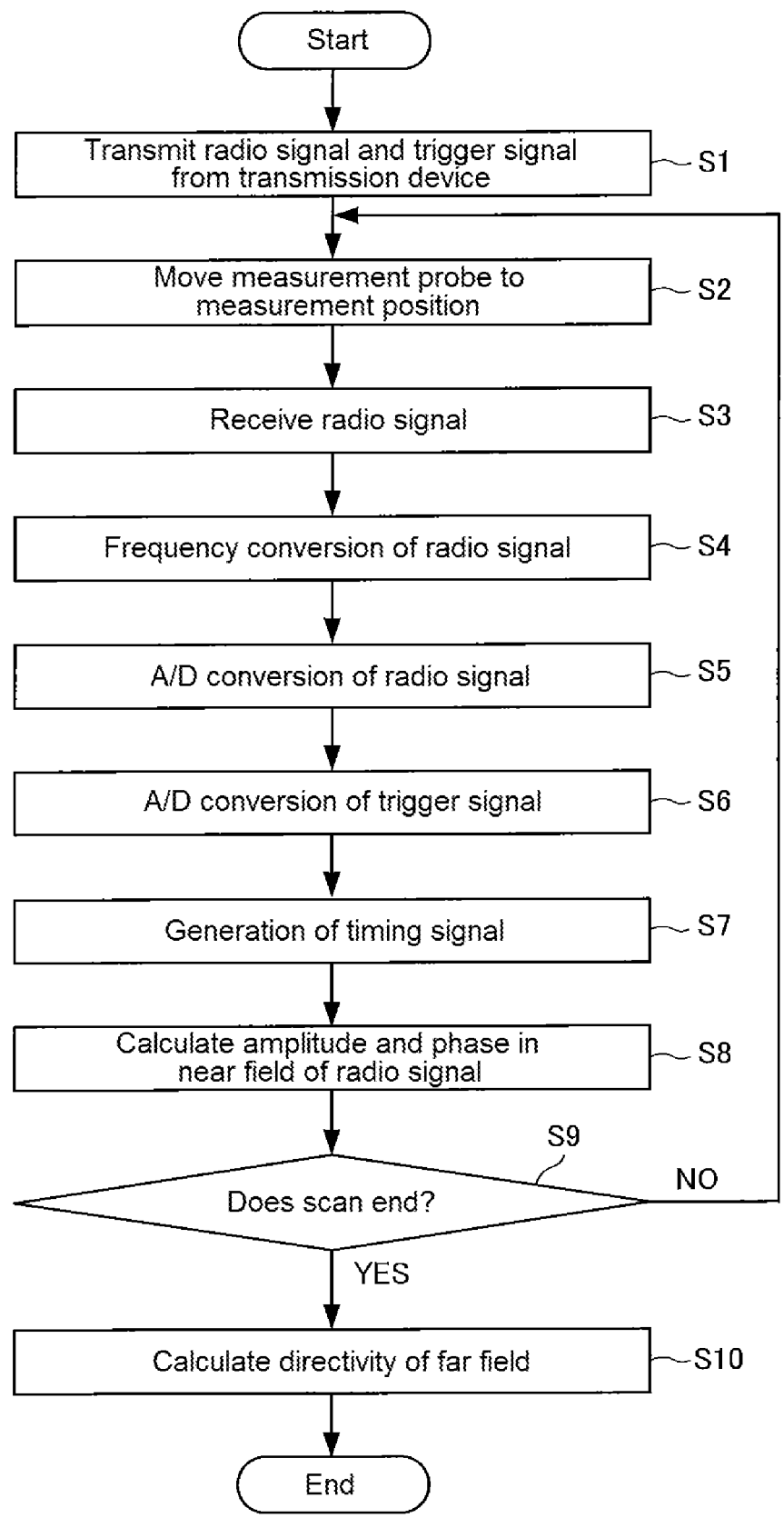
FIG. 10 is a flowchart showing a process of a near-field measurement method in the near-field measurement system according to the first embodiment.

Hereinafter, a near-field measurement method using the near-field measurement system 1 of this embodiment will be described with reference to the flowchart of FIG. 10.

The radio signal generation unit 101 of the transmission device 100 transmits a radio signal, and the trigger signal generation unit 102 of the transmission device 100 transmits a trigger signal synchronized with the transmission of the radio signal (radio signal transmission step S1).

Then, the scan control unit 21 causes the movement device 12 to move the measurement probe 11 to the measurement position within the scan range (movement step S2).

Then, the measurement probe 11 receives the radio signal output from the antenna under measurement 110 (signal reception step S3).

Then, the down-converter 13 frequency-converts a frequency of the radio signal received in the signal reception step S3 into a desired frequency (frequency conversion step S4).

Then, the A/D converter 14a digitizes (samples and quantizes) the radio signal subjected to the frequency conversion in the frequency conversion step S4 to generate a digital signal for measurement (first A/D conversion step S5).

Then, the A/D converter 14b digitizes (samples and quantizes) the trigger signal transmitted in the radio signal transmission step S1 to generate a digital synchronization signal (second A/D conversion step S6).

Then, the DSP 18 generates a timing signal for starting the measurement of the amplitude and the phase of the radio signal from the trigger signal digitized in the second A/D conversion step S6 (timing processing step S7).

Then, the amplitude and phase calculation unit 19 acquires the radio signal digitized in the first A/D conversion step S5 on the basis of the timing signal for each measurement position, and calculates the amplitude and the phase in a near field of the acquired radio signal (amplitude and phase calculation step S8).

Then, the control unit 24 determines whether or not the position information, the phase information, and the amplitude information have been acquired for all measurement positions within the scan range (step S9). In the case of a negative determination, the process proceeds to the movement step S2. In the case of a positive determination, the process proceeds to step S10.

Then, the far-field directivity calculation unit 20 calculates the directivity of the far field using the position information, the phase information, and the amplitude information for all the measurement positions (far-field directivity calculation step S10).

As described above, the near-field measurement system 1 according to this embodiment can reduce the number of frequency converters in the device by performing phase measurement on the basis of the timing signal for correcting deterioration of the trigger signal output from the transmission device 100, and perform near-field measurement of which an error is small with an inexpensive configuration.

Further, the near-field measurement system 1 according to this embodiment can execute phase measurement of the radio signal while maintaining a constant phase relationship among the trigger signal, the local signal, and the clock signal at a timing of measurement at each measurement position by performing the synchronization among the radio signal, the trigger signal, the local signal, and the clock signal and appropriately setting frequencies of the radio signal, the trigger signal, and the local signal.

Further, the near-field measurement system 1 according to this embodiment can use a timing of the reference signal inside the measurement device as a reference for phase measurement.

Further, in the near-field measurement system 1 according to this embodiment, in a case where the radio signal transmitted from the antenna under measurement 110 of the transmission device 100 is an OFDM signal, the phase and the amplitude are calculated for each sub-carrier. It is possible to measure a broadband electric field intensity signal at a time using a broadband signal of an OFDM or the like, which can contribute to high speed.

Second Embodiment

Next, a near-field measurement system 2 according to a second embodiment of the present invention will be described with reference to the drawings. The same components as those of the near-field measurement system 1 according to the first embodiment are denoted with the same reference numerals and detailed description thereof will be omitted.

Figure 11:
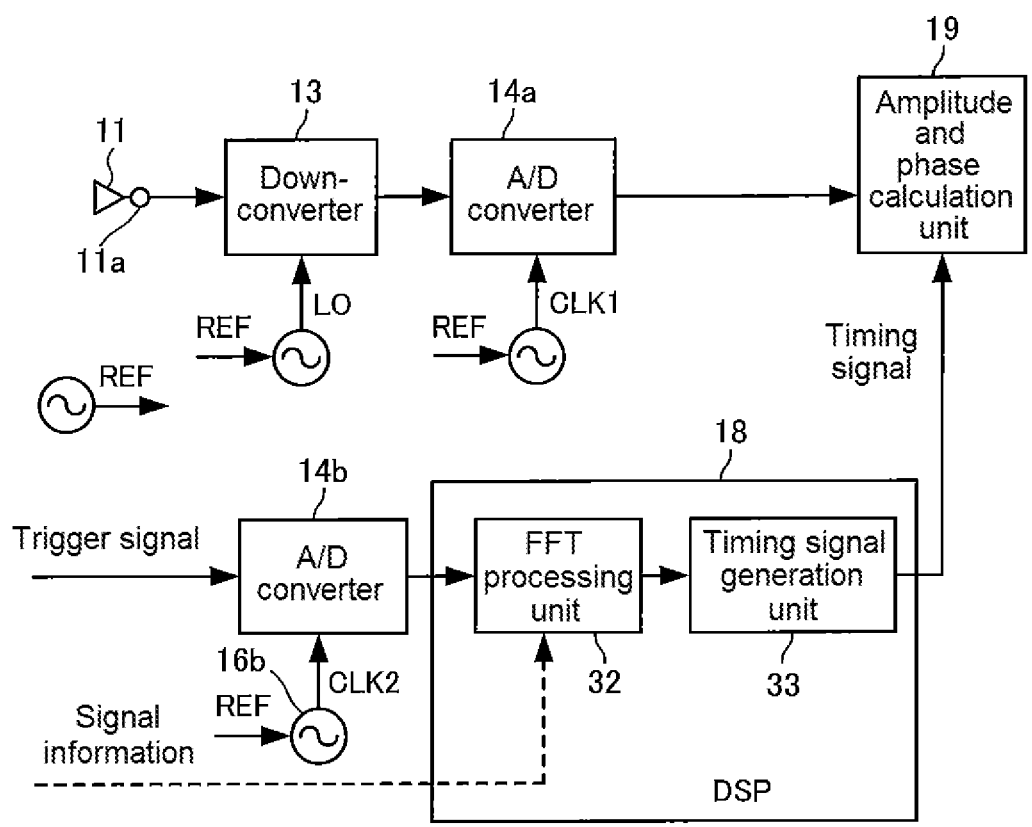
FIG. 11 is a block diagram illustrating a configuration of a DSP of a near-field measurement system according to a second embodiment.

As illustrated in FIG. 11, in this embodiment, the DSP as a timing processing unit includes an FFT processing unit 32 as a phase calculation unit that calculates a phase from the trigger signal (digital synchronization signal) digitized by the A/D converter 14*b* on the basis of the information on the trigger signal output from the transmission device 100, and a timing signal generation unit 33 that generates a timing signal on the basis of the phase calculated by the FFT processing unit 32.

In this embodiment, the trigger signal is a continuous wave (hereinafter CW). The transmission device 100 outputs a value of the frequency of the CW wave as the information on the trigger signal to the FFT processing unit 32.

Figure 12A:
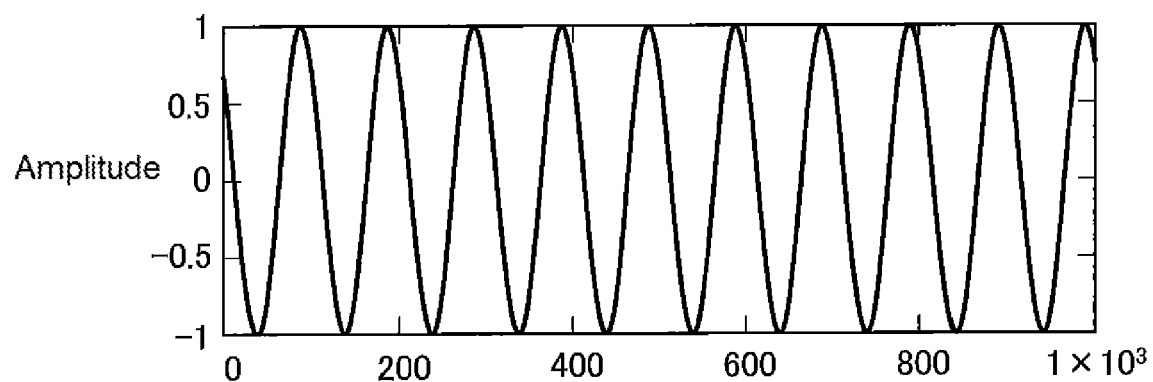
FIG. 12A is a graph showing an example of a waveform of a digital synchronization signal sampled by an A/D converter.
Figure 12B:
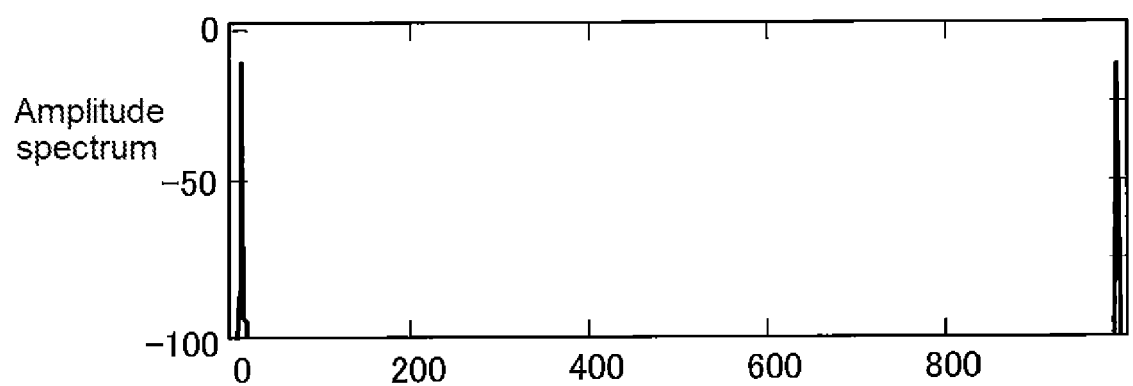
FIG. 12B is a graph showing an example of an amplitude spectrum obtained by an FFT processing unit.

FIG. 12A illustrates a waveform of the digital synchronization signal sampled in the A/D converter 14*b*. FIG. 12B illustrates an amplitude spectrum obtained by fast Fourier transform (FFT) or discrete Fourier transform (DFT) in the FFT processing unit 32.

Figure 13A:
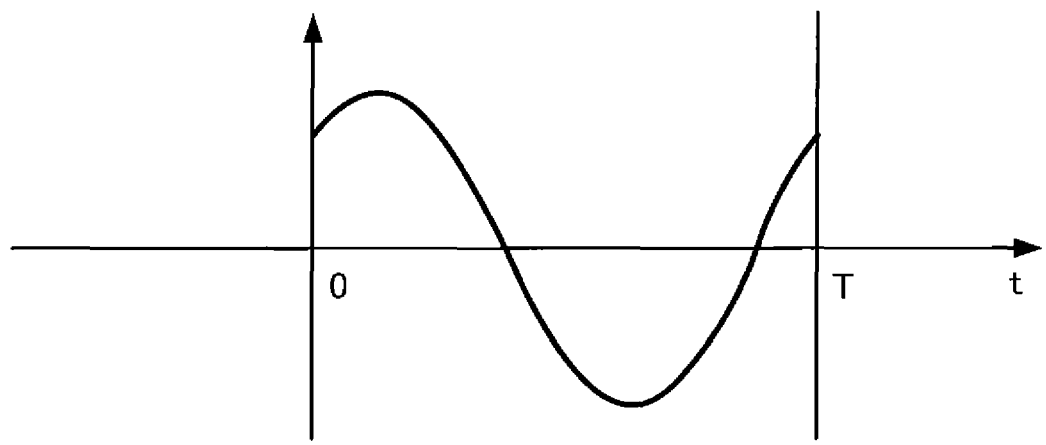
FIG. 13A is a graph showing an example of a time window of processing in the FFT processing unit.
Figure 13B:
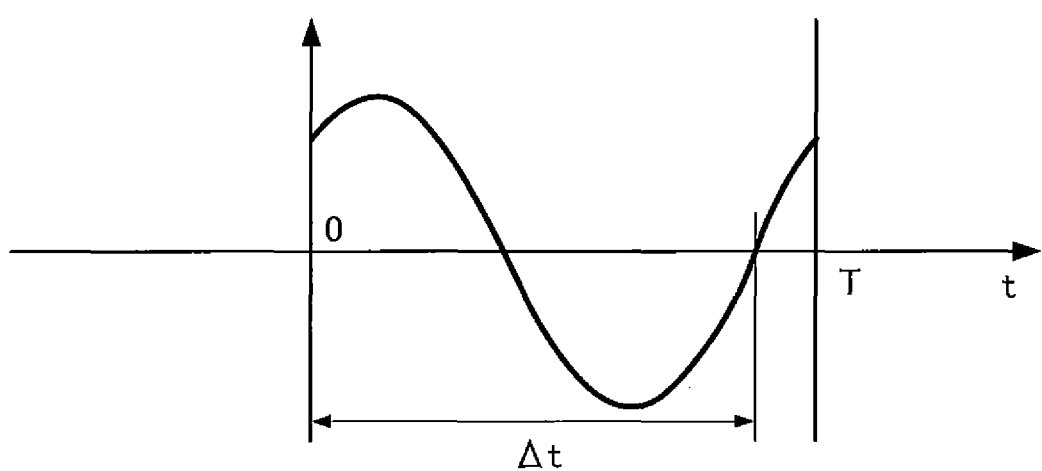
FIG. 13B is a graph showing a zero phase of a digital synchronization signal sampled by the A/D converter.
Figure 13C:
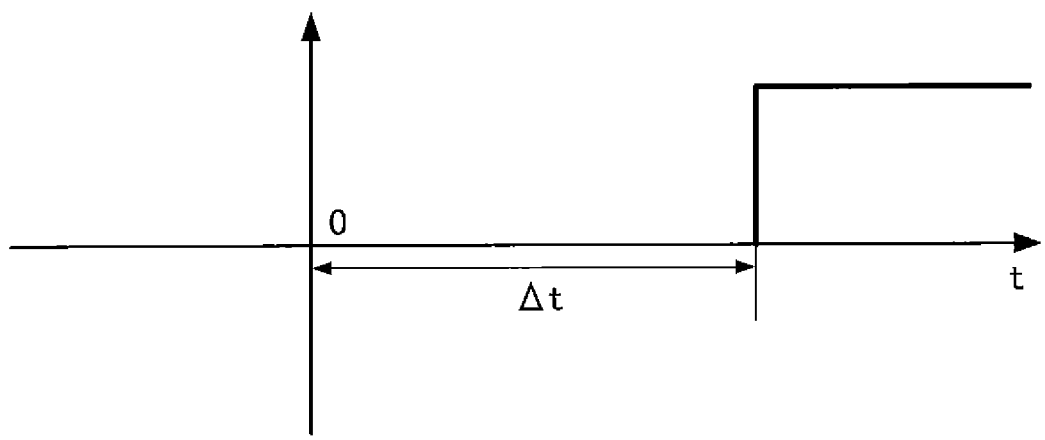
FIG. 13C is a graph showing an example of a timing signal generated by the FFT processing unit.

Further, the FFT processing unit 32 obtains a timing Δt of a zero phase as illustrated in FIG. 13B at a time window T based on the frequency of the CW as illustrated in FIG. 13A for the digital synchronization signal sampled in the A/D converter 14*b*. Further, as illustrated in FIG. 13C, the timing signal generation unit 33 generates a timing signal rising from Δt and outputs the timing signal to the amplitude and phase calculation unit 19.

As described above, the near-field measurement system 2 according to this embodiment can generate a timing signal from the phase information on the trigger signal from the transmission device 100.

Third Embodiment

Next, a near-field measurement system 3 according to a third embodiment of the present invention will be described with reference to the drawings. The same components as those of the near-field measurement system 1 according to the first embodiment are denoted with the same reference numerals and detailed description thereof will be omitted.

Figure 14:
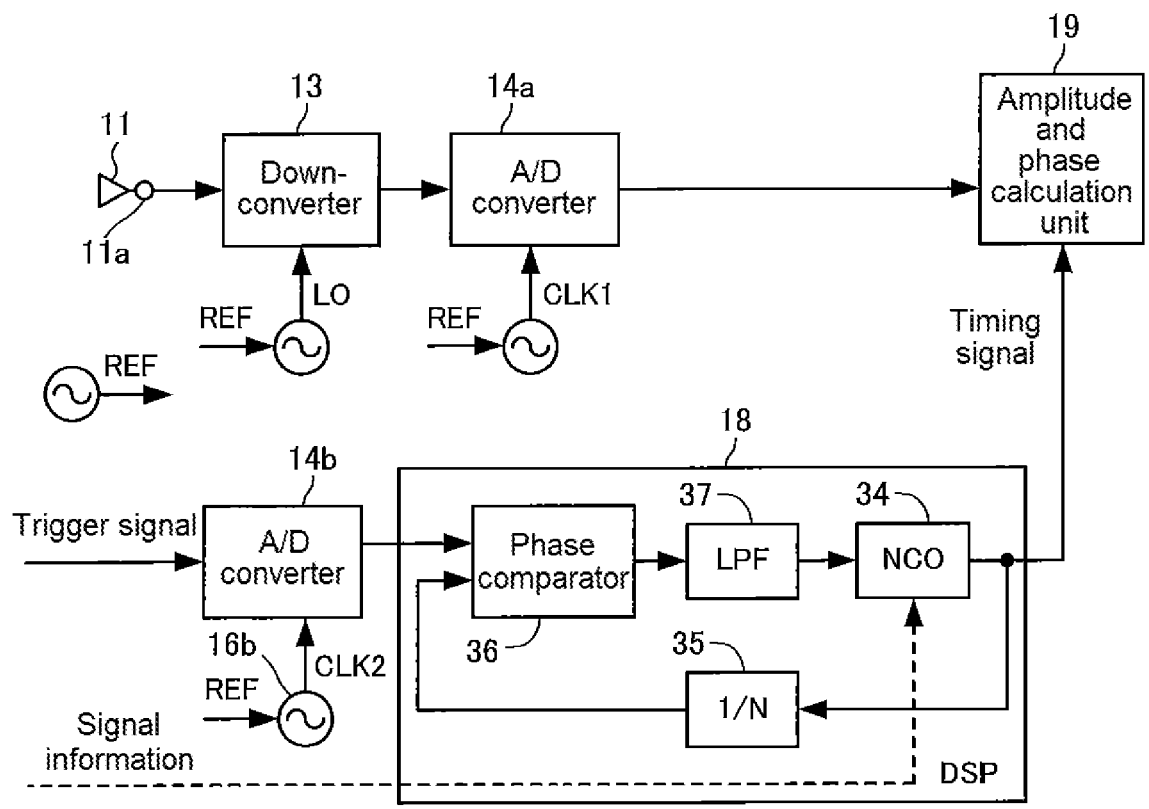
FIG. 14 is a block diagram illustrating a configuration of a DSP of a near-field measurement system according to a third embodiment.

As illustrated in FIG. 14, in this embodiment, a DSP 18 as timing processing unit includes a numerically controlled oscillator (NCO) 34 as a numerically controlled oscillator that controls a frequency of an output signal according to an input signal, an in-loop frequency divider 35 that divides an output signal from the NCO 34 by 1/N, a phase comparator 36 that outputs an error signal according to a phase difference between the output signal divided by the in-loop frequency divider 35 and a trigger signal digitized by an A/D converter 14*b*, and a low-pass filter (LPF) 37 as a loop filter that passes a low frequency component of the error signal output from the phase comparator 36 and provides the low frequency component to the NCO 34.

In this embodiment, the output signal from the NCO 34 is input as a timing signal to the amplitude and phase calculation unit 19.

In the embodiment, the trigger signal is a CW. Further, the transmission device 100 outputs a value of a frequency of the CW as information on the trigger signal to the NCO 34. Accordingly, an oscillation frequency of the NCO 34 matches the frequency of the CW.

The in-loop frequency divider 35 divides the output of the NCO 34 by 1/N and outputs a resultant output. Here, N is a real number equal to or greater than 1.

The phase comparator 36 outputs an error signal according to a frequency difference and a phase difference between the trigger signal digitized by the A/D converter 14*b* and the output signal from the in-loop frequency divider 35. The error signal is, for example, a signal having a pulse width proportional to the frequency difference and the phase difference.

The LPF 37 smoothes the output of the phase comparator 36 and outputs a resultant output to the NCO 34.

As described above, the near-field measurement system 3 according to the embodiment can use a signal phase-synchronized with the trigger signal from the transmission device 100 as the timing signal.

Fourth Embodiment

Next, a near-field measurement system 4 according to a fourth embodiment of the present invention will be described with reference to the drawings. The same components as those of the near-field measurement system 1 according to the first embodiment are denoted with the same reference numerals and a detailed description thereof will be omitted.

Figure 15:
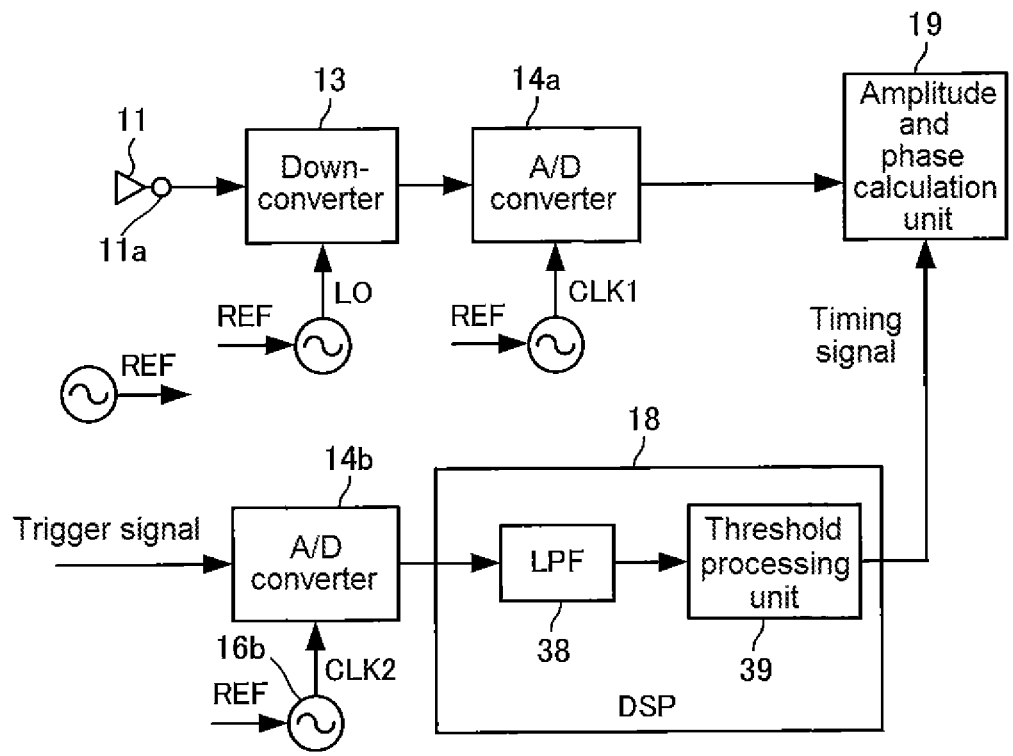
FIG. 15 is a block diagram illustrating a configuration of a DSP of a near-field measurement system according to a fourth embodiment.

As illustrated in FIG. 15, in this embodiment, a DSP 18 as a timing processing unit includes a low-pass filter (LPF) 38 that passes a low frequency component of a trigger signal digitized by an A/D converter 14*b*, and a threshold processing unit 39 that outputs a signal obtained by performing threshold processing on the trigger signal that has passed through the LPF 38, as a timing signal. In this embodiment, the trigger signal is a pulse signal.

Figure 16:
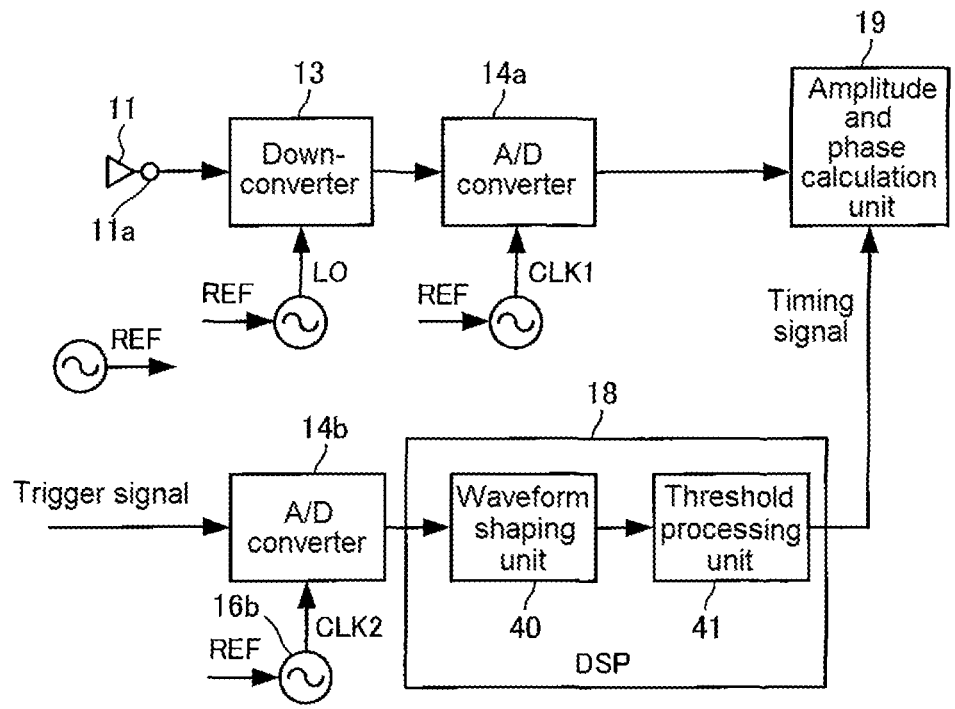
FIG. 16 is a block diagram illustrating another configuration of the DSP of the near-field measurement system according to the fourth embodiment.
Figure 17:
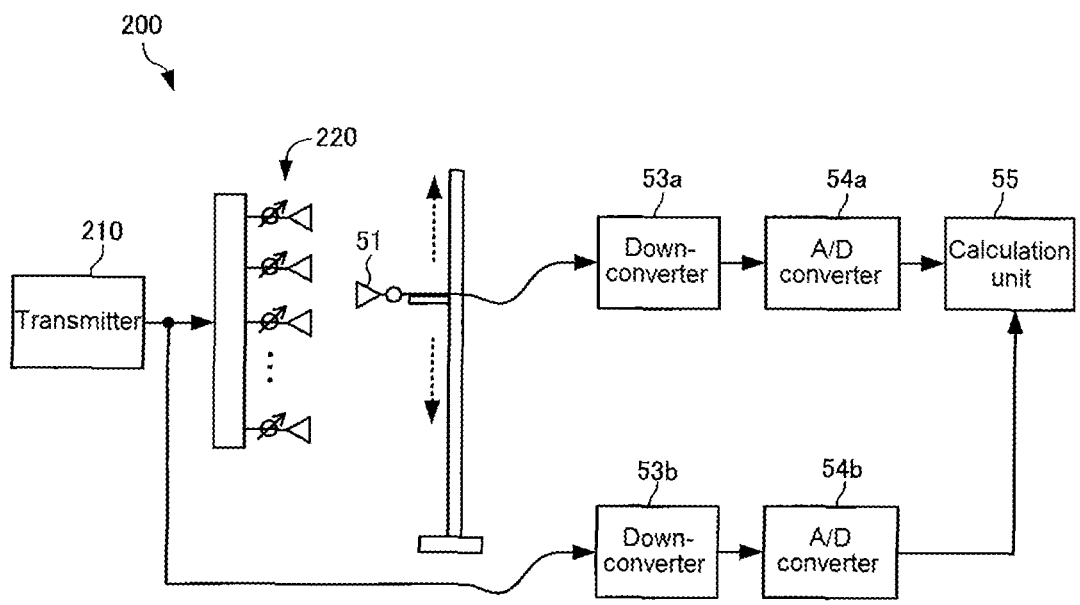
FIG. 17 is a block diagram illustrating a configuration of a near-field measurement system of the related art.

Alternatively, as illustrated in FIG. 16, the DSP 18 as the timing processing unit may include a waveform shaping unit 40 that changes frequency characteristics of the trigger signal digitized by the A/D converter 14*b*, and a threshold processing unit 41 that outputs, as the timing signal, a signal obtained by performing threshold processing on the trigger signal of which the frequency characteristics has been changed by the waveform shaping unit 40.

As described above, the near-field measurement system 4 according to this embodiment can use the signal obtained by waveform-shaping the trigger signal from the transmission device 100 as the timing signal.

DESCRIPTION OF REFERENCE NUMERALS AND SIGNS

1 to 4: near-field measurement system
11: measurement probe
12: movement device
13: down-converter
14*a*, 14*b*: A/D converter
15: local signal source
16*a*, 16*b*: clock signal source
17, 120: reference signal source
18: DSP 19: amplitude and phase calculation unit
20: far-field directivity calculation unit
30: signal source
31: correlator
32: FFT processing unit
33: timing signal generation unit
34: NCO
35: in-loop frequency divider
36: phase comparator
37, 38: LPF
39, 41: threshold processing unit
40: waveform shaping unit
100: transmission device
101: radio signal generation unit
102: trigger signal generation unit
110: antenna under measurement
T1 to TN: antenna element

What is claimed is:

1. A near-field measurement system that measures, in a near field, a radio signal that is transmitted from an antenna under measurement included in a transmission device, the near-field measurement system comprising:
a measurement probe that receives the radio signal at a plurality of measurement positions included in a predetermined scan range;
a movement device that moves the measurement probe to the plurality of measurement positions;
a frequency converter that frequency-converts a frequency of the radio signal received by the measurement probe to a desired frequency;
a first A/D converter that digitizes the radio signal frequency-converted by the frequency converter;
an amplitude and phase calculation unit that acquires the radio signal digitized by the first A/D converter for each measurement position and calculates an amplitude and a phase in a near field of the acquired radio signal;
a second A/D converter that digitizes a synchronization signal output from the transmission device in synchronization with the transmission of the radio signal; and
a timing processing unit that generates a timing signal for starting measurement of the amplitude and the phase of the radio signal from the synchronization signal digitized by the second A/D converter,
wherein the amplitude and phase calculation unit acquires the digitized radio signal on the basis of the timing signal.

2. The near-field measurement system according to claim 1, further comprising:
a far-field directivity calculation unit that calculates directivity of a far field using information on the amplitude and the phase calculated by the amplitude and phase calculation unit.

3. The near-field measurement system according to claim 1,
wherein the timing processing unit includes:
a signal source that generates a reference signal of the synchronization signal on the basis of information on the synchronization signal output from the transmission device; and
a correlator that outputs, as the timing signal, a signal obtained by cross-correlation between the reference signal generated by the signal source and the synchronization signal digitized by the second A/D converter.

4. The near-field measurement system according to claim 1,
wherein the timing processing unit includes:
a phase calculation unit that calculates a phase from the synchronization signal digitized by the second A/D converter on the basis of information on the synchronization signal output from the transmission device; and
a timing signal generation unit that generates the timing signal on the basis of the phase calculated by the phase calculation unit.

5. The near-field measurement system according to claim 1,
wherein the timing processing unit includes:
a numerically controlled oscillator that controls a frequency of an output signal according to an input signal;
an in-loop frequency divider that divides the output signal from the numerically controlled oscillator by 1/N, N being an integer;
a phase comparator that outputs an error signal according to a phase difference between the output signal divided by the in-loop frequency divider and the synchronization signal digitized by the second A/D converter; and
a loop filter that passes a low frequency component of the error signal and applies the low frequency component to the input signal of the numerically controlled oscillator,
wherein the output signal from the numerically controlled oscillator is input to the amplitude and phase calculation unit as the timing signal.

6. The near-field measurement system according to claim 1,
wherein the timing processing unit includes:
a low pass filter that passes a low frequency component of the synchronization signal digitized by the second A/D converter; and
a threshold processing unit that outputs, as the timing signal, a signal obtained by performing threshold processing on the synchronization signal passing through the low pass filter.

7. The near-field measurement system according to claim 1,
wherein the timing processing unit includes:
a waveform shaping unit that changes frequency characteristics of the synchronization signal digitized by the second A/D converter; and
a threshold processing unit that outputs, as the timing signal, a signal obtained by performing threshold processing on the synchronization signal of which frequency characteristics have been changed by the waveform shaping unit.

8. A near-field measurement method using the near-field measurement system according to claim 1, the method comprising:
a radio signal transmission step of transmitting the radio signal and the synchronization signal synchronized with the transmission of the radio signal from the transmission device;
a movement step of moving the measurement probe to the plurality of measurement positions;
a signal reception step of receiving the radio signal using the measurement probe at the plurality of measurement positions included in the predetermined scan range;
a frequency conversion step of frequency-converting the frequency of the radio signal received in the signal reception step to the desired frequency using the frequency converter;

a first A/D conversion step of digitizing the radio signal frequency-converted in the frequency conversion step using the first A/D converter;
an amplitude and phase calculation step of calculating the amplitude and the phase in the near field of the acquired radio signal for each measurement position using the amplitude and phase calculation units;
a second A/D conversion step of digitizing the synchronization signal transmitted in the radio signal transmission step using the second A/D converter;
a timing processing step of generating the timing signal for starting measurement of the amplitude and the phase of the radio signal from the synchronization signal digitized in the second A/D conversion step; and
a far field directivity calculation step of calculating the directivity of the far field using information on the amplitude and the phase calculated in the amplitude and phase calculation step using a far field directivity calculation unit,
wherein the amplitude and phase calculation step includes acquiring the radio signal digitized in the first A/D conversion step on the basis of the timing signal.

9. The near-field measurement system according to claim 1, further comprising:
a local signal source that outputs a local signal;
a first clock signal source that outputs a first clock signal; and
a second clock signal source that outputs a second clock signal,
wherein the antenna under measurement includes a plurality of antenna elements,
the frequency converter mixes the radio signal received by the measurement probe with the local signal,
the first A/D converter samples the radio signal frequency-converted by the frequency converter with the first clock signal, and
the second A/D converter samples the synchronization signal with the second clock signal.

10. The near-field measurement system according to claim 9, further comprising:
a far-field directivity calculation unit that calculates directivity of a far field using information on the amplitude and the phase calculated by the amplitude and phase calculation unit.

11. The near-field measurement system according to claim 9,
wherein the timing processing unit includes:
a signal source that generates a reference signal of the synchronization signal on the basis of information on the synchronization signal output from the transmission device; and
a correlator that outputs, as the timing signal, a signal obtained by cross-correlation between the reference signal generated by the signal source and the synchronization signal digitized by the second A/D converter.

12. The near-field measurement system according to claim 9,
wherein the timing processing unit includes:
a phase calculation unit that calculates a phase from the synchronization signal digitized by the second A/D converter on the basis of information on the synchronization signal output from the transmission device; and
a timing signal generation unit that generates the timing signal on the basis of the phase calculated by the phase calculation unit.

13. The near-field measurement system according to claim 9,
wherein the timing processing unit includes:
a numerically controlled oscillator that controls a frequency of an output signal according to an input signal;
an in-loop frequency divider that divides the output signal from the numerically controlled oscillator by 1/N, N being an integer;
a phase comparator that outputs an error signal according to a phase difference between the output signal divided by the in-loop frequency divider and the synchronization signal digitized by the second A/D converter; and
a loop filter that passes a low frequency component of the error signal and applies the low frequency component to the input signal of the numerically controlled oscillator,
wherein the output signal from the numerically controlled oscillator is input to the amplitude and phase calculation unit as the timing signal.

14. The near-field measurement system according to claim 9,
wherein the timing processing unit includes:
a low pass filter that passes a low frequency component of the synchronization signal digitized by the second A/D converter; and
a threshold processing unit that outputs, as the timing signal, a signal obtained by performing threshold processing on the synchronization signal passing through the low pass filter.

15. The near-field measurement system according to claim 9,
wherein the timing processing unit includes:
a waveform shaping unit that changes frequency characteristics of the synchronization signal digitized by the second A/D converter; and
a threshold processing unit that outputs, as the timing signal, a signal obtained by performing threshold processing on the synchronization signal of which frequency characteristics have been changed by the waveform shaping unit.

16. The near-field measurement system according to claim 9,
wherein the transmission device includes:
a reference signal source that outputs a reference signal;
a radio signal generation unit that generates the radio signal synchronized with the reference signal; and
a trigger signal generation unit that generates the synchronization signal synchronized with the reference signal,
wherein the local signal, the first clock signal, and the second clock signal are synchronized with the reference signal, and
each of a frequency of the local signal and a frequency of the radio signal is an integer multiple of a frequency of the synchronization signal.

17. The near-field measurement system according to claim 16,
wherein the timing processing unit includes:
a signal source that generates a reference signal of the synchronization signal on the basis of information on the synchronization signal output from the transmission device; and
a correlator that outputs, as the timing signal, a signal obtained by cross-correlation between the reference signal generated by the signal source and the synchronization signal digitized by the second A/D converter.

18. The near-field measurement system according to claim 16,
wherein the timing processing unit includes:
a phase calculation unit that calculates a phase from the synchronization signal digitized by the second A/D converter on the basis of information on the synchronization signal output from the transmission device; and
a timing signal generation unit that generates the timing signal on the basis of the phase calculated by the phase calculation unit.

19. The near-field measurement system according to claim 16,
wherein the timing processing unit includes:
a numerically controlled oscillator that controls a frequency of an output signal according to an input signal;
an in-loop frequency divider that divides the output signal from the numerically controlled oscillator by 1/N, N being an integer;
a phase comparator that outputs an error signal according to a phase difference between the output signal divided by the in-loop frequency divider and the synchronization signal digitized by the second A/D converter; and
a loop filter that passes a low frequency component of the error signal and applies the low frequency component to the input signal of the numerically controlled oscillator,
wherein the output signal from the numerically controlled oscillator is input to the amplitude and phase calculation unit as the timing signal.

20. The near-field measurement system according to claim 16,
wherein the timing processing unit includes:
a low pass filter that passes a low frequency component of the synchronization signal digitized by the second A/D converter; and
a threshold processing unit that outputs, as the timing signal, a signal obtained by performing threshold processing on the synchronization signal passing through the low pass filter.

* * * * *